United States Patent
Park (12)

(10) Patent No.: US 7,361,537 B2
(45) Date of Patent: Apr. 22, 2008

(54) METHOD OF FABRICATING RECESS CHANNEL ARRAY TRANSISTOR

(75) Inventor: Je-Min Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 295 days.

(21) Appl. No.: 10/969,751

(22) Filed: Oct. 19, 2004

(65) Prior Publication Data

US 2005/0095794 A1    May 5, 2005

(30) Foreign Application Priority Data

Oct. 22, 2003    (KR)    ............... 10-2003-0073637

(51) Int. Cl.
*H01L 21/336*    (2006.01)
(52) U.S. Cl. ............... 438/196; 438/589; 257/E21.655
(58) Field of Classification Search ............... 438/296, 438/589; 257/E21.655
See application file for complete search history.

(56) References Cited

U.S. PATENT DOCUMENTS

| | | | | |
|---|---|---|---|---|
| 5,539,229 | A * | 7/1996 | Noble et al. ............... | 257/301 |
| 5,907,170 | A * | 5/1999 | Forbes et al. ............... | 257/296 |
| 6,146,970 | A * | 11/2000 | Witek et al. ............... | 438/424 |
| 6,252,277 | B1 | 6/2001 | Chan et al. | |
| 6,515,319 | B2 * | 2/2003 | Widmann et al. ............ | 257/288 |
| 6,624,021 | B2 * | 9/2003 | Noble ............... | 438/253 |
| 6,858,505 | B2 * | 2/2005 | Park ............... | 438/301 |
| 2004/0009644 | A1 | 1/2004 | Suzuki | |

FOREIGN PATENT DOCUMENTS

KR    2003-0048894    6/2003

OTHER PUBLICATIONS

English language abstract of Korean Publication No. 2003-0048894.

* cited by examiner

*Primary Examiner*—Michael Lebentritt
*Assistant Examiner*—Stanetta Isaac
(74) *Attorney, Agent, or Firm*—Marger Johnson & McCollom, P.C.

(57) ABSTRACT

A method of fabricating a recess channel array transistor is disclosed. An impurity region is formed in a semiconductor substrate. Then, a polysilicon layer is formed on the semiconductor substrate, both of which are then etched to form a trench that defines an active region. By filling the trench with an insulating material, a STI and an interlayer insulating layer are formed. A patterned mask layer is formed to be used for etching the polysilicon layer and the interlayer insulating layer, thereby forming an opening that defines a contact pad. A Spacer is formed along a sidewall of the contact pad. Using the mask layer and the spacer, the semiconductor substrate is etched to thereby form a recess channel trench. Thereafter, a gate insulating layer and a gate conductive layer are formed. A nitride layer is formed on the resultant structure, and chemical mechanical polishing is performed to isolate the nodes.

26 Claims, 9 Drawing Sheets

METHOD OF FABRICATING RECESS CHANNEL ARRAY TRANSISTOR

BACKGROUND OF THE INVENTION

This application claims the priority of Korean Patent Application No. 2003-73637, filed on Oct. 22, 2003, in the Korean Intellectual Property Office, the disclosure of which is incorporated herein in its entirety by reference.

1. Field of the Invention

The present invention relates to a method of manufacturing a semiconductor integrated circuit device, and more particularly to a method of fabricating a recess channel array transistor (RCAT) used for a highly integrated semiconductor circuit.

2. Description of the Related Art

Lengths of channels are being shortened as a result of high packing density in semiconductor devices such as DRAMs, causing short channel effect and punchthrough between source and drain regions, of which influences are hardly controlled. Particularly, design rules are gradually decreased to result in short channel effect and increased amount of ion implantation, which in turn increases a leakage current. Therefore, it is difficult to secure a refresh time of a DRAM. Recess channel array transistors are MOSFET devices suggested for solving the foregoing problems. In order to overcome the problems caused by the decreased lengths of channels due to the shrinkage of the devices, a recess channel array transistor is suggested, which is a semiconductor device capable of securing a sufficiently increased channel length by forming a recess channel trench in a portion where a channel of the transistor is formed later.

FIG. 1 is a sectional view showing a structure of a conventional recess channel array transistor.

Referring to FIG. 1, a recess channel trench 130 is formed in a semiconductor substrate 100 that is formed with a field ion implanting region 105, an ion-implanted impurity region 115, and source/drain regions 180. A gate oxide layer 135 is formed along an inner wall of the recess channel trench 130. Also, a gate stack 165 formed of sequentially stacking a gate polysilicon layer 140a, a gate metal layer 150a and a capping layer 160a is formed on the gate oxide layer 135, thereby thoroughly filling the recess channel trench 130. Sidewalls of the gate stack 165 are formed with spacers 170, and contact pads 190a, 190b and 195 self-aligned using the spacers 170 are formed on insides an interlayer insulating layers 185. A reference numeral 110 denotes a shallow trench isolation (STI) layer that defines an active region. The recess channel array transistor constructed as above has a channel formed along an outer periphery of the recess channel trench 130. Accordingly, the length of the channel becomes longer than that of a planar type transistor. Therefore, punchthrough between the source and drain can be minimized.

However, according to the method of fabricating the conventional recess channel transistor, a process of forming a recess channel trench is added. Thus, a misalignment margin is trivial when an active region pattern is formed, a recess channel trench pattern, a gate pattern and a self aligned contact (SAC), so that photolithography of forming the patterns becomes fastidious. In other words, the recess channel trench pattern has no misalignment margin with not only the active region but also a gate, thereby making the process complicated and fastidious. Japanese Patent Laid-open No. 2002-353445 discloses a method of fabricating a recess channel transistor in an active region isolated by a STI.

FIGS. 2a through 2e are sectional views showing a method of fabricating a conventional recess channel array transistor.

Referring to FIG. 2a, after an ion implanting region 105 is formed in a semiconductor substrate 100, an isolating layer 110 such as STI is formed for defining an active region. By source/drain ion implanting to a surface of the semiconductor substrate 100, a surface ion-implanted source/drain impurity region 115 is formed. Then, a mask pattern of a photoresist layer 125 that opens portions to be formed with recess channel trenches is formed on the semiconductor substrate 100. When a highly narrow recess channel trench is intended, a hard mask layer such as a silicon nitride layer may be used instead of using the photoresist layer.

Referring to FIG. 2b, the semiconductor substrate 100 is etched using the photoresist layer 125 as an etch mask, thereby forming a recess channel trench 130. As shown in FIG. 2c, a gate oxide layer 135 is formed on a surface of the recess channel trench 130. Then, a conductive polysilicon 140, a metal 150 such as WSi, and an insulating material 160 such as silicon nitride for a capping layer are sequentially stacked on the gate oxide layer 135.

As shown in FIG. 2d, the insulating material 160 for the capping layer, the gate metal 150 and the conductive polysilicon 140 are patterned, so that a gate stack 165 formed of a capping layer 160a, a gate metal layer 150a and a gate polysilicon layer 140a is formed. Spacers 170 formed of silicon nitride are formed along sidewalls of the gate stack 165. Thereafter, the spacers 170 and the capping layer 160a are used as masks during performing the source/drain ion implantation, thereby forming source/drain 180 in the semiconductor substrate 100.

Referring to FIG. 2e, an interlayer insulating layer 185 is formed on the entire surface of the resultant structure, and a portion of the interlayer insulating layer 185 in which a contact is formed later is selectively removed via photolithography and etching, forming a contact hole. Conductive polysilicon is then deposited to fill the contact hole and planarized via chemical mechanical polishing (CMP), thereby forming self-aligned contact pads 190a, 190b and 195. By doing so, a recess channel array transistor is fabricated. If the recess channel array transistor fabricated as above is used as a cell transistor of a DRAM cell, the self-aligned contact pads 190a, 190b and 195 are electrically connected to a lower electrode or a bit line (not shown) of a cell capacitor, respectively.

In the method of fabricating the conventional recess channel array transistor as described above, an added process of forming a recess channel trench requires an additional photolithography step. Thus, photolithography is repeated four times to fabricate the recess channel array transistor. To summarize, photolithography is used to form 1) an active region pattern using the STI, 2) a recess channel trench pattern, 3) a gate pattern, and 4) a self-aligned contact (or self-aligned contact pads) pattern. Accordingly, a decreasing design rule of a semiconductor device results in a decreased misalignment margin between the recess channel trench pattern and the active region, as well as a decreased misalignment margin between the recess channel trench pattern and the gate pattern. As a result, the fabricating process of the recess channel array transistor is complicated, and a short can occur due to misalignment.

For example, if an undesired trench is formed in an isolating layer of a field region caused by the misalignment between the recess channel trench and the active region, an operation of the transistor may fail. Also, when the misalignment between the recess channel trench and the gate inhibits precise formation of the gate on the recess channel trench, the gate may be shorted with a neighboring contact pad (e.g., the contact pad 195 connected to the bit line).

Therefore, it is desirable to know and use a method of fabricating a recess channel array transistor capable of sufficiently securing a misalignment margin between the recess channel trench, the active region, the gate and the self-aligned contact.

SUMMARY OF THE INVENTION

The present invention provides a method of fabricating a recess channel array transistor, in which an active region pattern, a recess channel trench pattern, a gate pattern and a self-aligned contact pattern are formed by the fewest times of photolithography, thereby simplifying a process of fabricating the recess channel array transistor.

The present invention also provides a method of fabricating a recess channel array transistor, in which an active region pattern, a recess channel trench pattern, a gate pattern, and a self-aligned contact pattern are formed altogether, using two times of photolithography, thereby sufficiently securing a misalignment margin between respective patterns.

According to an aspect of the present invention, there is provided a method of fabricating a recess channel trench including (A) ion implanting to a semiconductor substrate to form an impurity region. Then, (B) a polysilicon layer is formed on the semiconductor substrate, and (C) the polysilicon layer and the semiconductor substrate are selectively etched to form a trench that defines an active region. (D) The trench that defines the active region is filled with an insulating material, and is planarized, thereby forming a STI and an interlayer insulating layer. Then, (E) a mask layer is formed on the polysilicon layer and the interlayer insulating layer, and the mask layer, the polysilicon layer and an interlayer insulating layer are selectively etched to form an opening that defines a contact pad. (F) A spacer is formed along a sidewall of the opening that defines the contact pad, and the semiconductor substrate is anisotropically etched to form a recess channel trench using the spacer and the mask layer as etch masks. Thereafter, (G) a gate insulating layer is formed along an inner wall of the recess channel trench. (H) A gate conductive layer is formed on the gate insulating layer to fill the recess channel trench. Finally, (I) the selectively-etched mask layer is removed to expose the polysilicon layer, and a capping layer may be formed on the gate conductive layer.

The step (A) may include forming source/drain regions in the semiconductor substrate.

The step (A) also includes forming an n-type well region that forms a p-channel MOS transistor when the semiconductor substrate is a p-type substrate. Additionally, the step (A) includes forming a p-type well region that forms an n-channel MOS transistor when the semiconductor substrate is an n-type substrate.

In the step (B), a portion of the polysilicon layer in contact with the impurity region of the semiconductor substrate is formed to have a conductivity type identical to that of the impurity region. Therefore, when an n+ type impurity region is formed in the semiconductor substrate, the portion of the polysilicon layer formed on the n+ type impurity region is an n+ type. When a p+ type impurity region is formed in the semiconductor substrate, the portion of the polysilicon layer on the p+ impurity region is a p+ type.

In the step (C), the active region defined by the trench may have a straight active structure. Otherwise, the active region defined by the trench has a diagonal active structure.

In the step (D), the STI and the interlayer insulating layer are integrally formed of the same insulating material to involve no interface between the STI and the interlayer insulating layer. Also, the insulating material that fills the active region is an insulating layer selected from a group consisting of an USG layer, a HDP oxide layer, a TEOS layer formed using PECVD, an oxide layer formed using PECVD, and a combination of these.

In the step (E), the mask layer formed on the polysilicon layer and the interlayer insulating layer may be a nitride layer. At this time, the step (E) of selectively etching the mask layer, the polysilicon layer and the interlayer insulating layer to form the opening that defines the contact pad is performed in such a manner that a pattern of the mask layer that defines a contact pad pattern is formed by photolithography, and the polysilicon layer and the interlayer insulating layer are selectively and anisotropically etched using the pattern of the mask layer as an etch mask.

The step (F) of forming the spacer along the sidewall of the opening includes depositing an insulating layer for a spacer on the resultant structure that includes the opening for defining the contact pad. Then, the insulating layer is anisotropically etched for the spacer. In this case, the insulating layer for the spacer may be formed by depositing a silicon nitride layer via PECVD or LPCVD.

In the step (G), the gate insulating layer formed along the inner wall of the recess channel trench may be a silicon oxide layer, a titanium oxide layer or a tantalum oxide layer.

The step (H) includes depositing a polysilicon layer that fills the recess channel trench on the gate insulating layer, and etching-back the polysilicon layer to form a gate polysilicon layer. Thereafter, a metal layer is formed on the gate polysilicon layer, and etch-back is performed to the metal layer to form a gate metal layer. In this case, the gate metal layer is formed of W or $WSi_x$.

The step (I) includes forming the nitride layer for a capping layer on the remaining mask layer and the gate conductive layer. Also, the remaining mask layer is removed via CMP to expose the polysilicon layer, and a capping layer formed of the nitride layer is formed on the gate conductive layer.

In the method of fabricating a recess channel array transistor according to one aspect of the present invention, the recess channel array transistor fabricated by the fabricating method is used as a cell transistor of a semiconductor memory device. Here, the polysilicon layer formed on the semiconductor substrate may act as a self-aligned contact pad in a cell region and act as a raised active in a core region.

According to another aspect of the present invention, there is provided a method of fabricating a recess channel array transistor including (a) ion-implanting to a semiconductor substrate to form an impurity region, and forming a polysilicon layer on the semiconductor substrate. Then, (b) the polysilicon layer and the semiconductor substrate are selectively etched via photolithography to form a trench that defines an active region. (c) The trench that defines the active region is filled with an insulating material and is then planarized to integrally form a STI and an interlayer insulating layer on the trench. (d) A nitride layer for a mask is formed on the resultant structure that includes the polysilicon layer and the interlayer insulating layer. (e) The nitride layer for the mask, the polysilicon layer and the interlayer insulating layer are patterned by photolithography to form an opening that defines a contact pad. (f) A spacer is formed along sidewalls of the patterned nitride layer for the mask, the polysilicon layer, and the interlayer insulating layer. Thereafter, (g) the semiconductor substrate is etched to form a recess channel trench using the patterned mask layer and the spacer as etch masks, and (h) a gate oxide layer is formed along the inner wall of the recess channel trench. (i) a conductive polysilicon layer that fills the recess channel trench is formed, and etch-back is performed to form a gate polysilicon layer. Then, (j) a metal layer is formed on the gate polysilicon layer, and performing etch-back to form a gate metal layer, and (k) a nitride layer for a capping layer is formed on the entire surface of the resultant structure including the mask layer and the gate metal layer. Finally, (l) the nitride layer for the capping layer is subjected to planarization processes such as chemical mechanical polishing to isolate nodes of the contact pad formed of the patterned polysilicon layer.

Here, the ion-implanting to the semiconductor substrate to form the impurity region in the step (a) includes forming source/drain regions in the semiconductor substrate.

In the step (a), the polysilicon layer is formed by doping an impurity by in-situ, and being deposited on the semiconductor substrate in a state of doped polysilicon. Then, the doped polysilicon layer portion in contact with the impurity region within the semiconductor substrate has a conductivity type identical to that of the impurity region.

Also, in the step (a), an undoped polysilicon layer is deposited and then doped via ion implantation to have conductivity, and the doped polysilicon layer portion in contact with the impurity region within the semiconductor substrate has a conductivity type identical to that of the impurity region.

In the step (b), the active region defined by the trench may have a straight active structure or a diagonal active structure.

In the method of fabricating a recess channel array transistor according to another aspect of the present invention, the recess channel array transistor fabricated by the fabricating method may be used as a cell transistor of a semiconductor memory device. In this case, the polysilicon layer formed on the semiconductor substrate acts as a self-aligned contact pad in a cell region and acts as a raised active in a core region.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

FIGS. 3 through 13 are perspective views illustrating a method of fabricating a recess channel array transistor according to one embodiment of the present invention.

Figure 1:
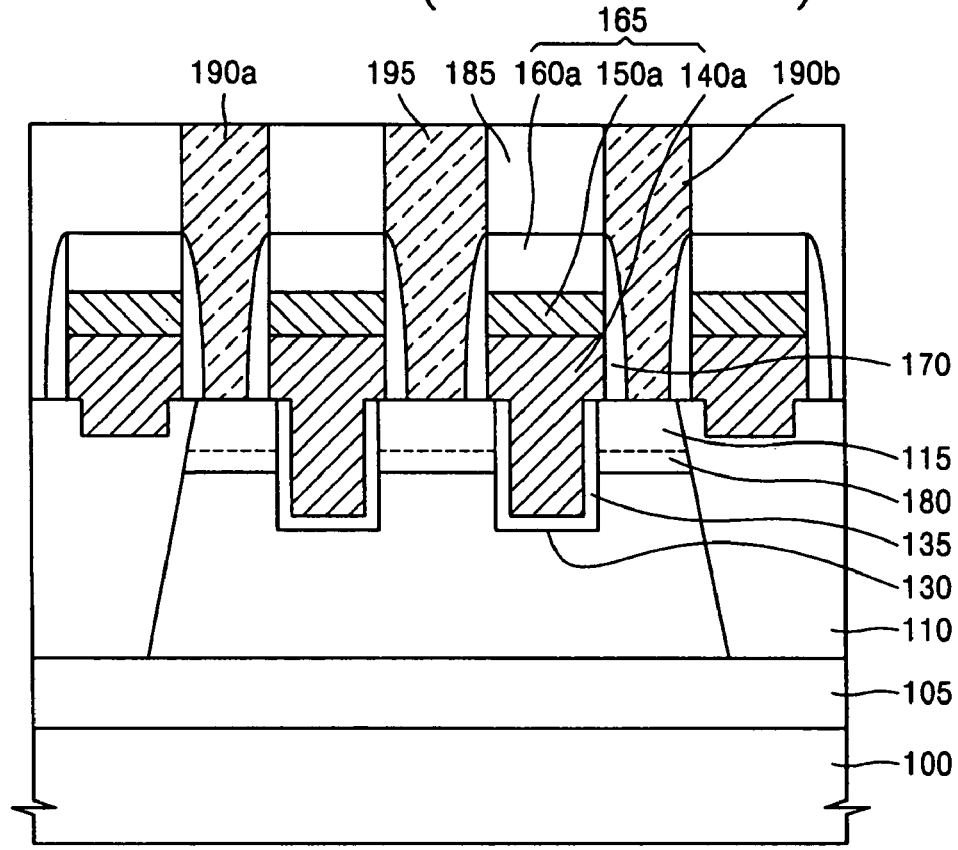
FIG. 1 is a cross-sectional view showing a conventional recess channel array transistor.
Figure 2A:
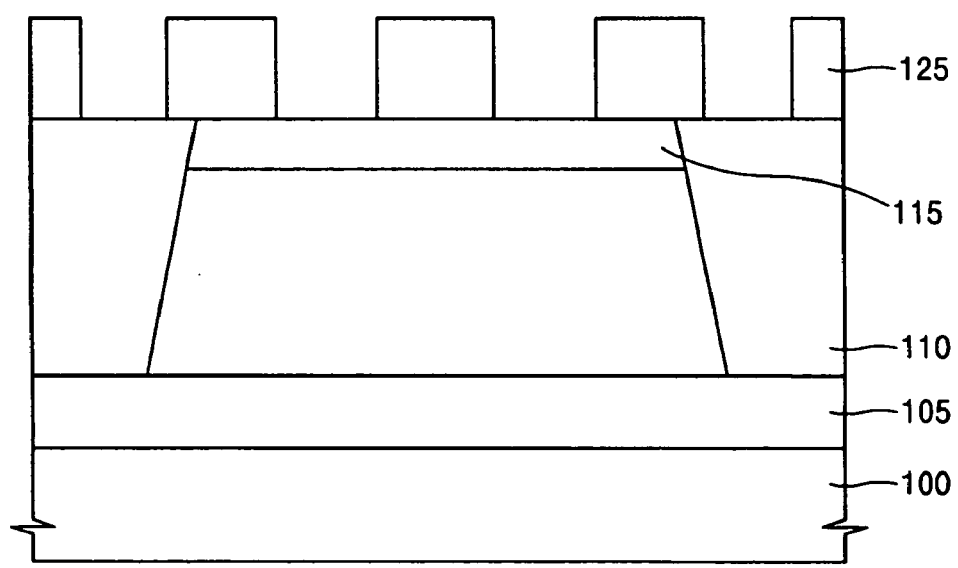
FIGS. 2a through 2e are cross-sectional views illustrating a conventional method of fabricating the recess channel array transistor.
Figure 2B:
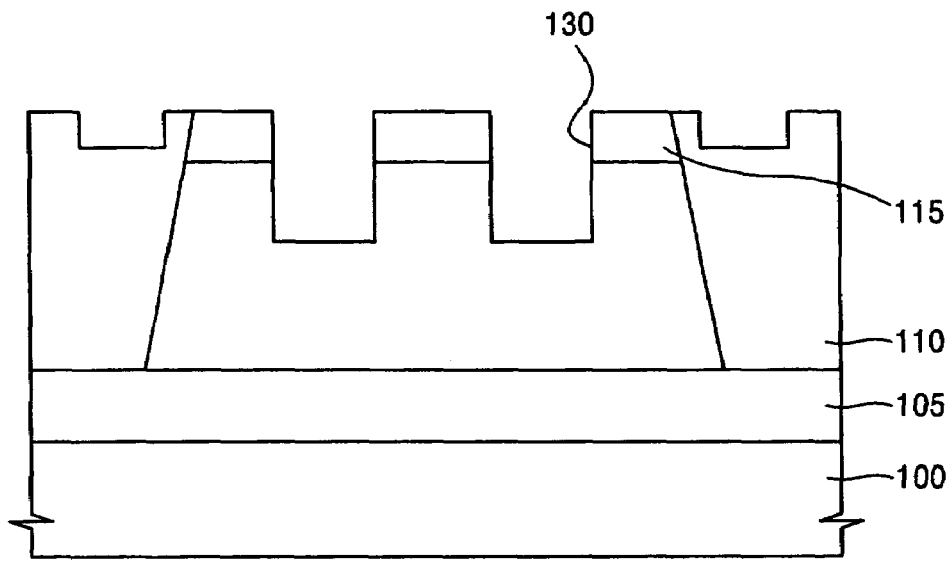
Figure 2C:
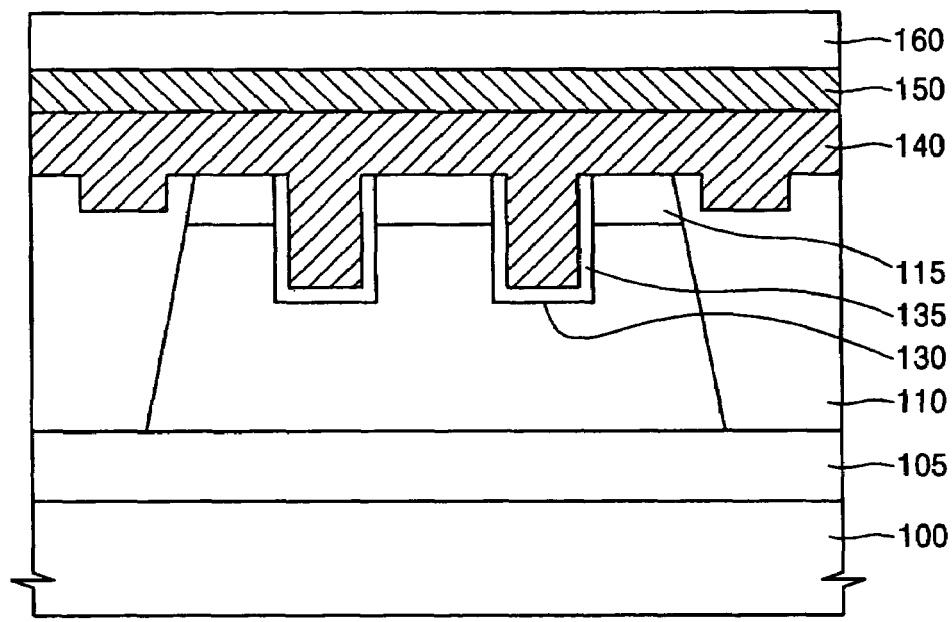
Figure 2D:
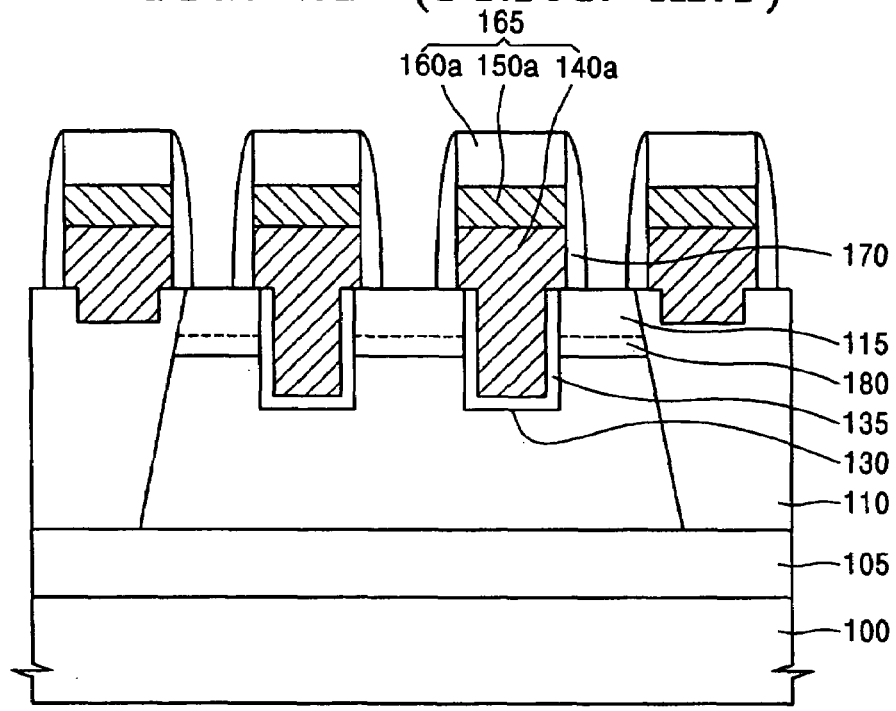
Figure 2E:
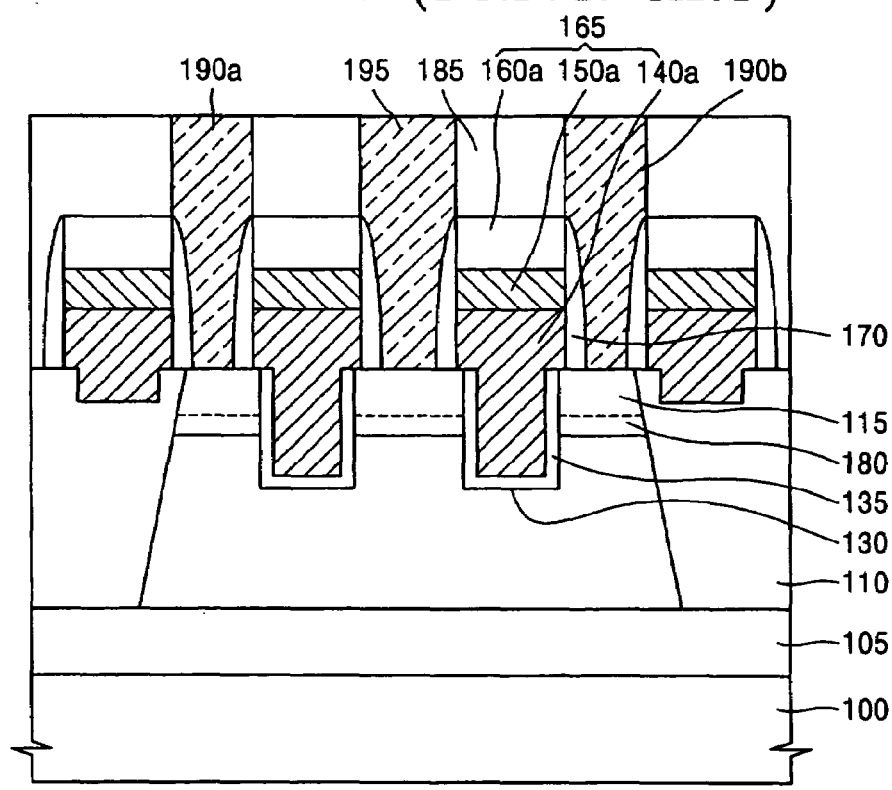
Figure 3:
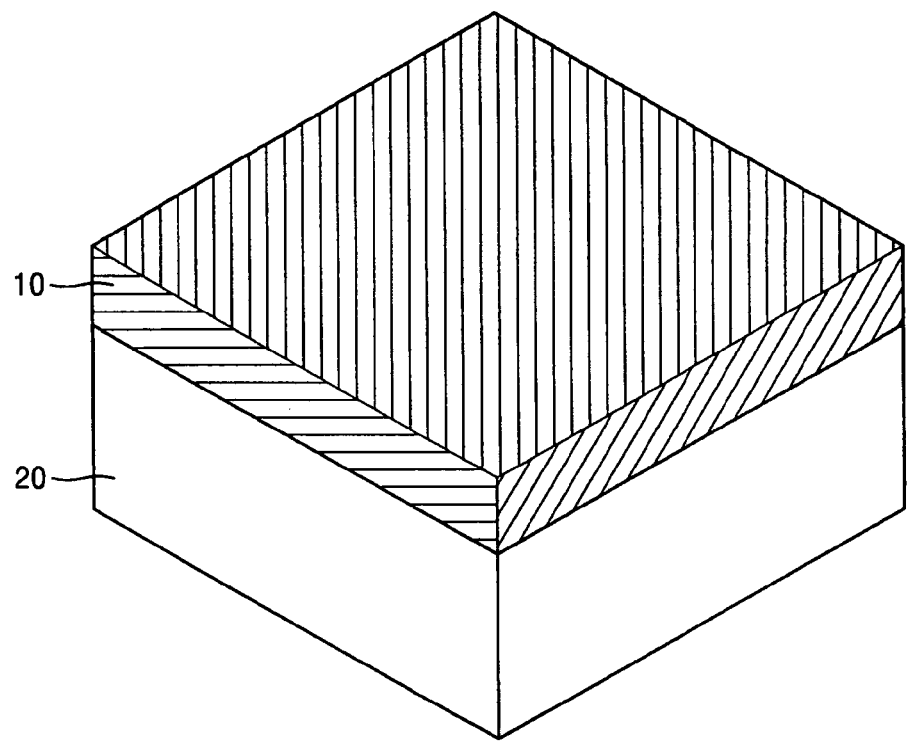
FIG. 3 through 13 are perspective views illustrating a method of fabricating a recess channel array transistor according to one embodiment of the present invention.

Referring to FIG. 3, a semiconductor substrate 20 is ion-implanted to form a necessary impurity region (not shown). Then, a polysilicon layer 10 is formed on the semiconductor substrate 20. The impurity regions formed using ion implantation into the semiconductor substrate 20 includes source/drain impurity regions. For example, when the semiconductor substrate 20 is P-type, n+ type source/drain impurity regions may be formed in the semiconductor substrate 20 for forming an n-channel MOS transistor. When an n-channel MOS transistor and a p-channel MOS transistor are formed on the same substrate, it is required to form a well region with a conductivity type different from that of the semiconductor substrate 20, which may be formed by ion implantation. More specifically, when the semiconductor substrate 20 is a p-type substrate, an n-type well region may be formed in the semiconductor substrate 20 for forming a p-channel MOS transistor. Otherwise, if the semiconductor substrate 20 is an n-type substrate, a p-type well region may be formed in the semiconductor substrate 20 for forming an n-channel MOS transistor.

The polysilicon layer 10 formed on the semiconductor substrate 20 is deposited under a state of doped polysilicon that is doped with impurities in an in-situ manner. Also, the polysilicon layer 10 is deposited on the semiconductor substrate 20 in an undoped state, and then is doped by ion implanting to be conductive. In either ease, the impurity region formed in the semiconductor substrate 20 should have the same conductivity type as the polysilicon layer 10 portion that is in contact with. Therefore, when an n+ type impurity region is formed in the semiconductor substrate 20, the polysilicon layer 10 portion in contact with the impurity region formed on the semiconductor substrate 20 is formed as n+ type. If a p+ type impurity region is formed in the semiconductor substrate, the polysilicon layer 10 portion formed on the p+ type impurity region is formed as p+ type.

Figure 4:
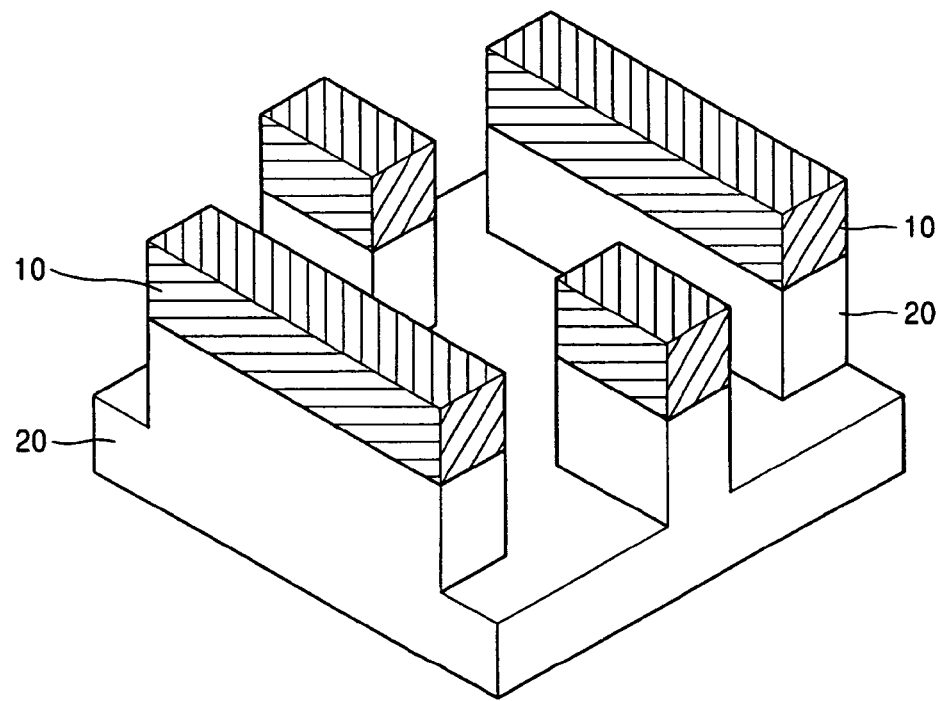

As shown in FIG. 4, the polysilicon layer 10 and the semiconductor substrate 20 are selectively etched, thereby forming a trench that defines an active region. Here, photolithography is performed in order to form such a trench.

Figure 5:
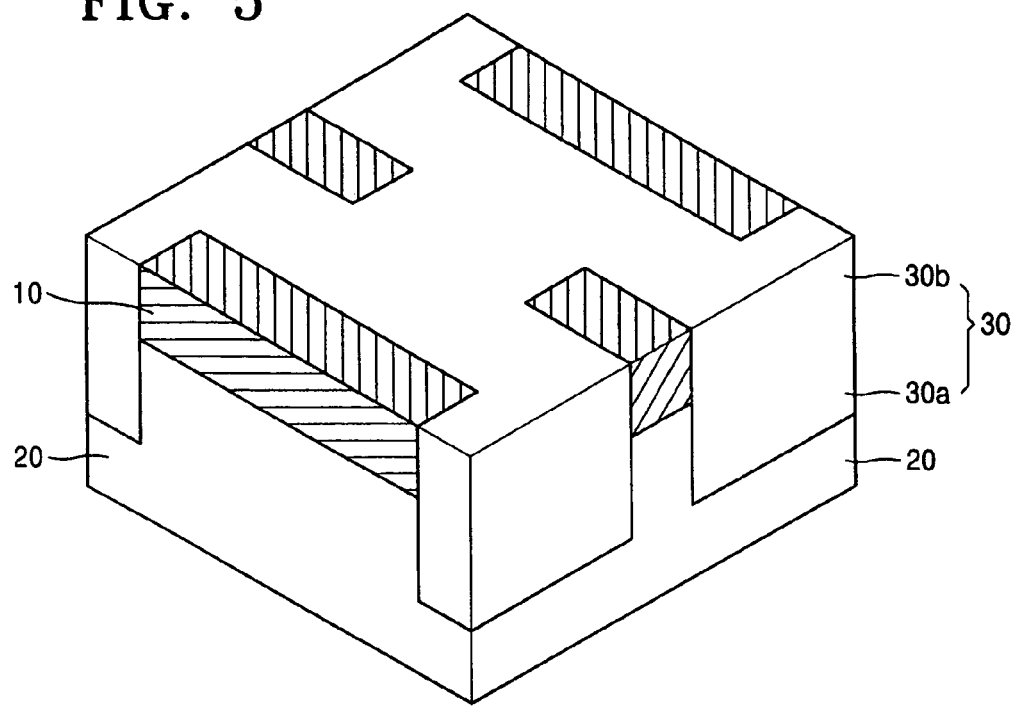

Referring to FIG. 5, the trench that defines the active region is filled with an insulating material, which is then planarized by CMP. Thus, a STI 30a and an interlayer insulating layer 30b are formed together. The insulating material that fills the trench includes a USG layer, a HDP layer, a HDP oxide layer, a TEOS layer using PECVD, and an oxide layer using PECVD. The STI 30a and the interlayer insulating layer 30b may be integrally formed by the same insulating material 30 without forming an interface between them.

Figure 6:
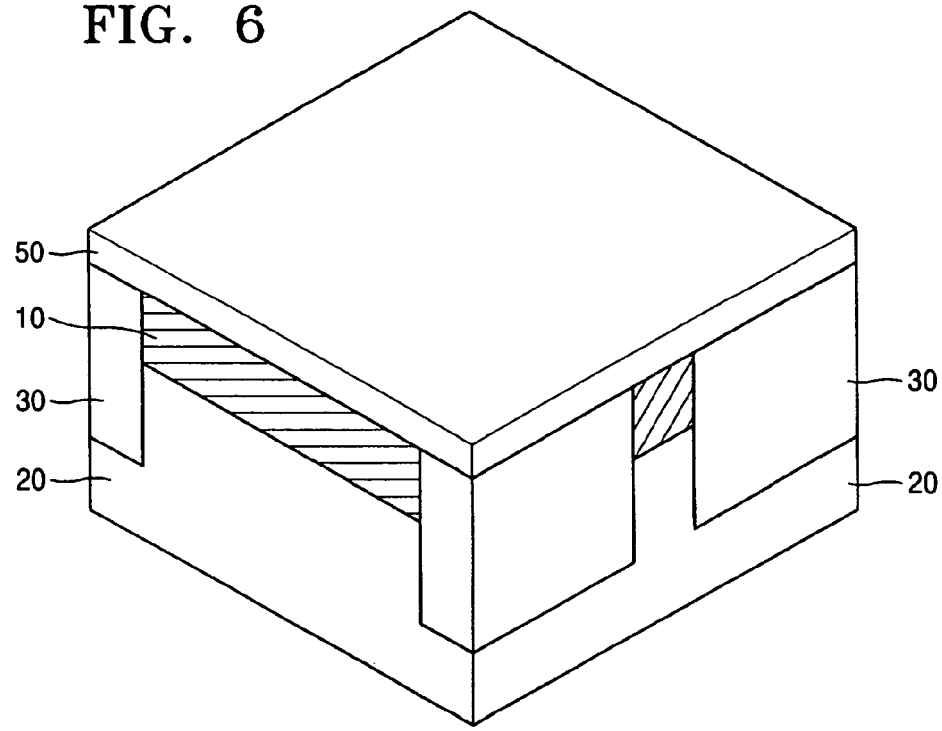

Referring to FIG. 6, a nitride layer 50 for a mask is formed on the entire surface of the resultant structure. A silicon nitride layer may be used. The nitride layer 50 for the mask protects underlying polysilicon layer 10, and is used as an etch mask when selectively etching the polysilicon layer 10 after performing patterning.

Figure 7:
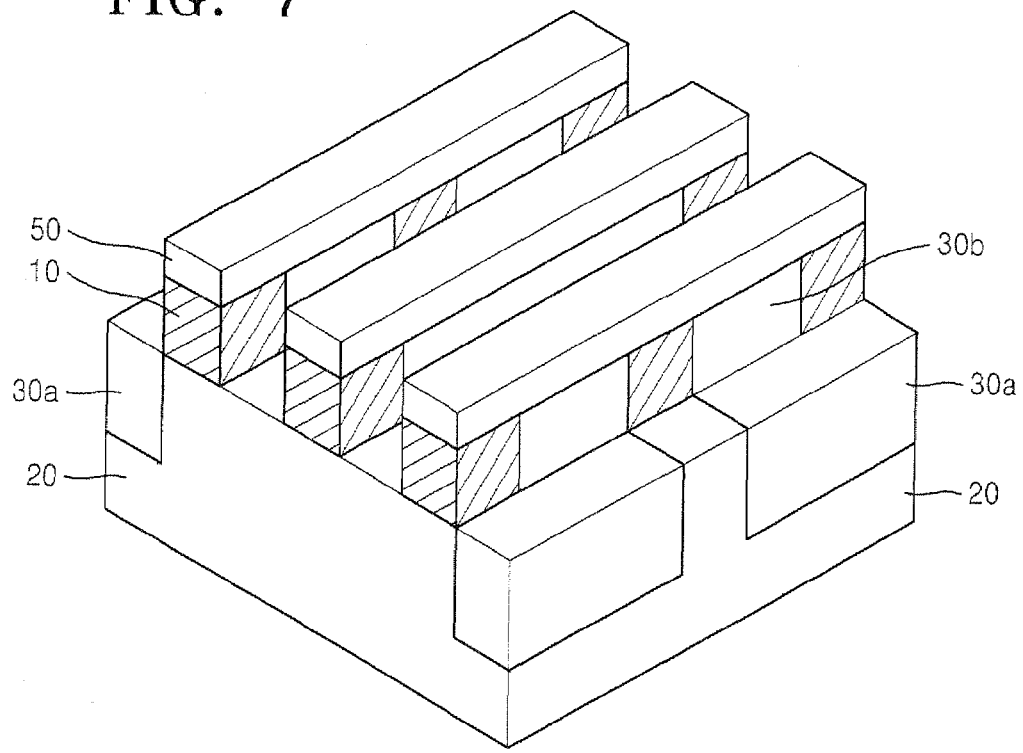

Referring to FIG. 7, the nitride layer 50 for the mask, polysilicon layer 10, and the interlayer insulating layer 30b are selectively etched, thereby forming an opening that defines a contact pad formed of a polysilicon layer 10 protruding upright from a surface of the semiconductor substrate 20. The opening may be formed in such a manner that the nitride layer 50 for the mask is patterned via photolithography, and portions of the polysilicon layer 10 and the interlayer insulating layer 30b opened by the nitride layer 50 for the mask are anisotropically etched using the patterned nitride layer 50 for the mask.

Figure 8:
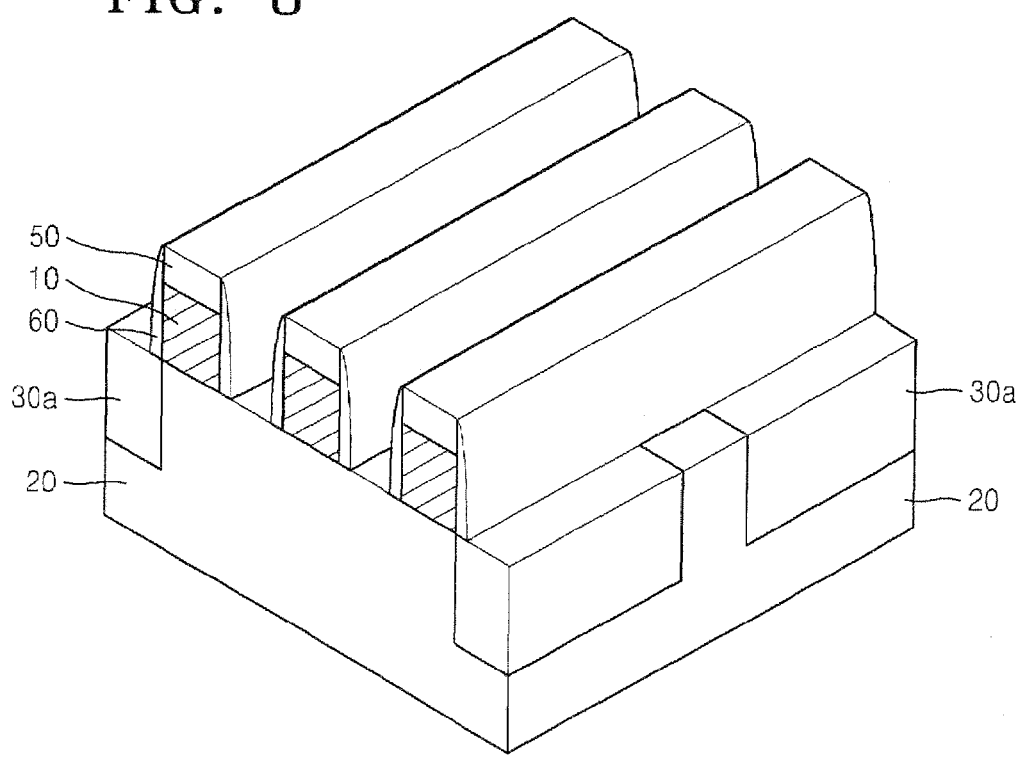

Referring to FIG. 8, spacers 60 are formed along sidewalls of the opening that defines the contact pad. The spacer 60 may be formed such that an insulating layer is deposited on the resultant structure including the opening for defining the contact pad, and then the silicon insulating layer for a spacer is anisotropically etched without using an etch mask. In this case, a silicon nitride layer may be deposited via PECVD or LPCVD as the silicon nitride layer for the spacer. The spacer 50 encircles both sidewalls of the contact pad formed of the polysilicon layer 10 and the nitride layer 50 for the mask thereon.

Figure 9:
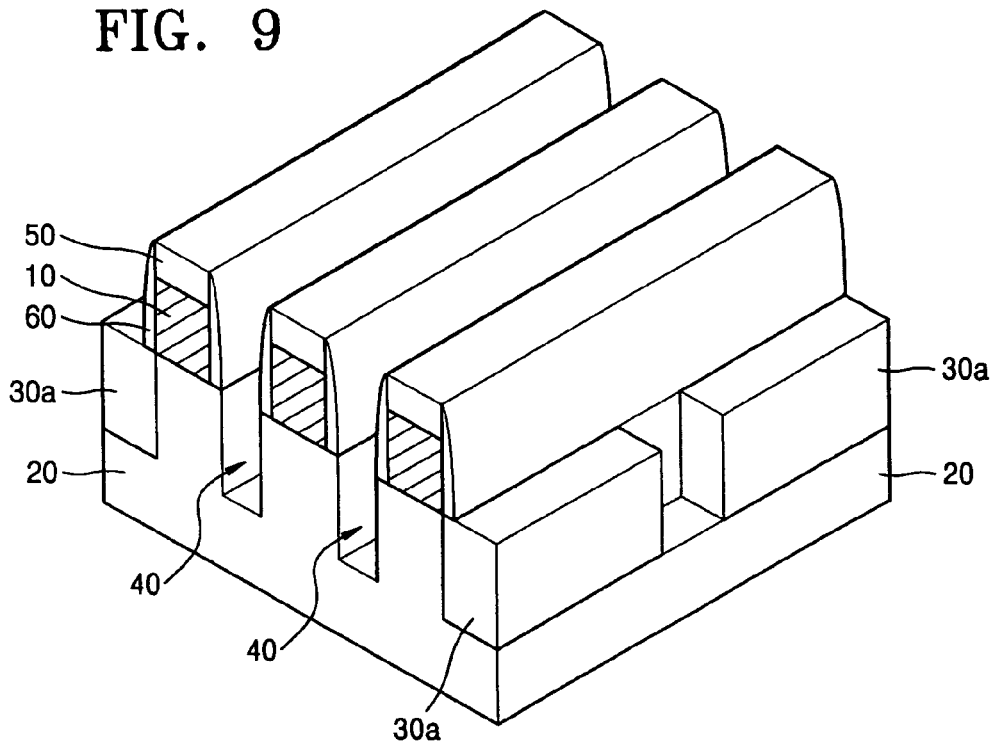

As shown in FIG. 9, the semiconductor substrate 20 is anisotropically etched using the spacer 60 and the nitride layer 50 as etch masks, thereby forming a recess channel trench 40. A channel of a recess channel transistor is formed along an outer periphery of the recess channel trench 40. During forming the recess channel trench 40, the polysilicon layer 10 is protected from etching by means of the nitride layer 50 and the spacer 60. Therefore, there is no need to separately perform photolithography that forms a pattern of the recess channel trench 40. Also, during etching the semiconductor substrate 20 for forming the recess channel trench 40, the insulating material that forms the STI 30a is etched together with the semiconductor substrate 20. At this time, an etch selectivity of the semiconductor substrate material to the insulating material that forms the STI 30a is set to be large, so that the semiconductor substrate material is etched faster. Accordingly, the trench 40 formed by etching is deeper in the semiconductor substrate 20 portion than in the STI 30a portion.

Figure 10:
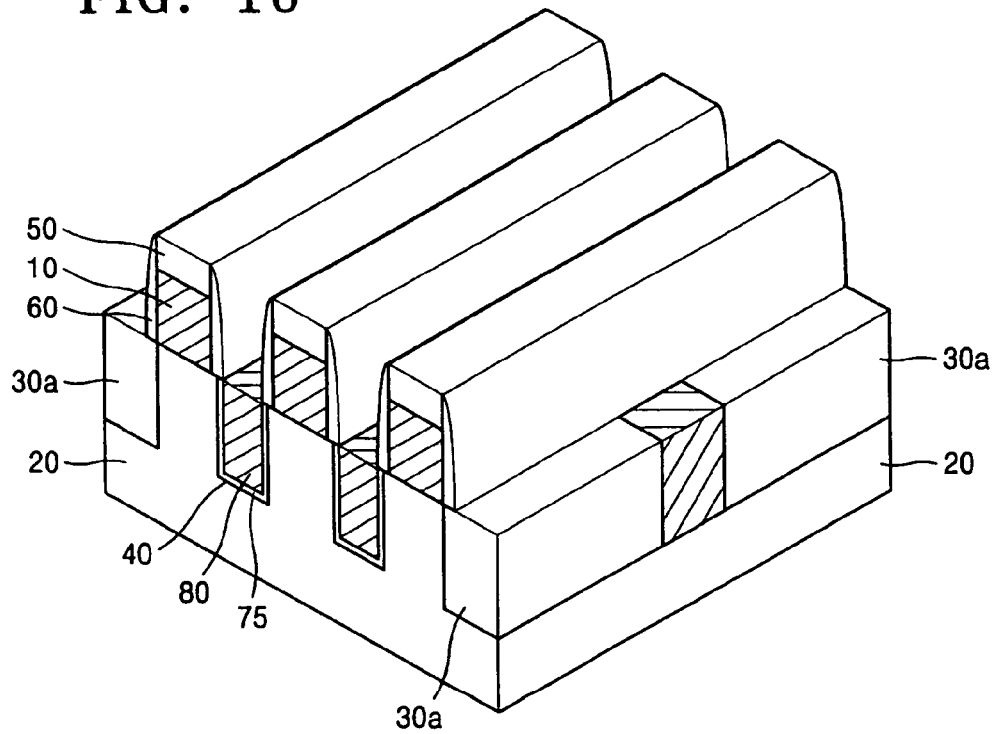

Referring to FIG. 10, a gate oxide layer 75 is formed along the inner wall of the recess channel trench 40. At this time, a silicon oxide layer, a titanium oxide layer or a tantalum oxide layer may be used as the gate oxide layer 75. Thereafter, a conductive polysilicon is deposited on the gate oxide layer 75 to fill the recess channel trench 40. Then, etch-back is performed to form a gate polysilicon layer 80.

Figure 11:
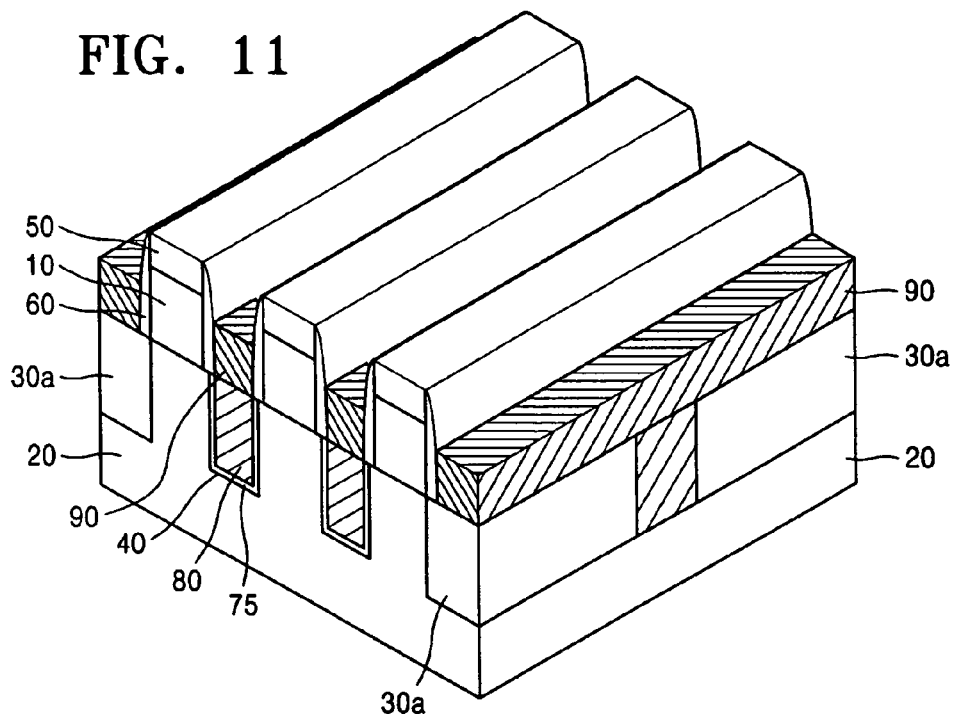

Referring to FIG. 11, a metal such as W or WSix is deposited on the gate polysilicon layer 80, which is then etched-back to form a gate metal layer 90. By doing so, a gate conductive layer formed of the gate polysilicon layer 80 and the gate metal layer 90 is formed.

Figure 12:
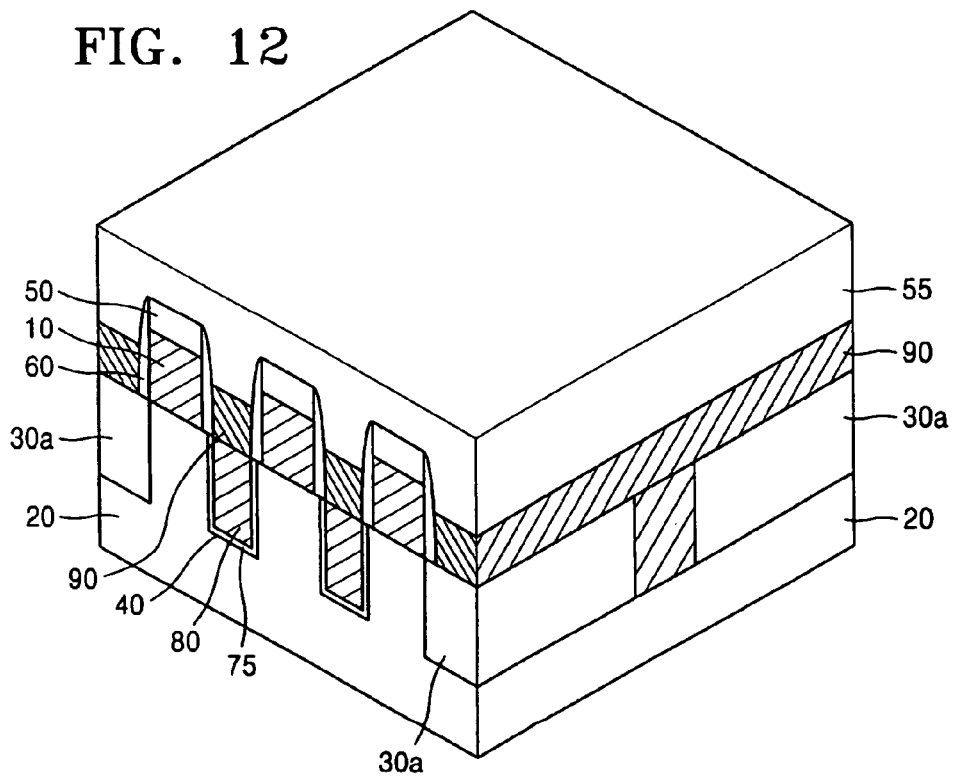

Referring to FIG. 12, a nitride layer 55 for a capping layer is covered over the entire surface of the resultant structure. The nitride layer 55 for the capping layer is provided to form a capping layer on the gate metal layer 90.

Figure 13:
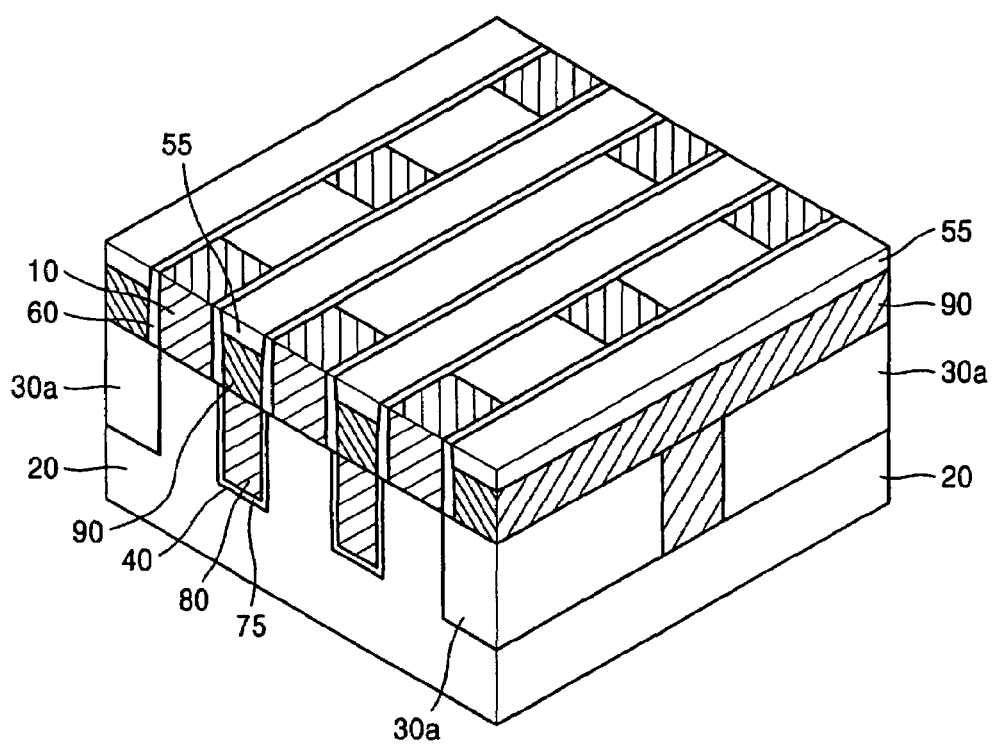

Referring to FIG. 13, CMP is performed to the nitride layer 55, so that a capping layer 55 is formed on the gate metal layer 90. The capping layer 55 isolates nodes of the contact pad formed of the polysilicon layer 10 and protects the gate metal layer 90. That is, the CMP process is performed until the polysilicon layer 10 is exposed by thoroughly removing the nitride layer for the mask (refer to the reference numeral 50 of FIG. 12) on the polysilicon layer 10.

Consequently, a gate stack formed of the gate polysilicon layer 80, the gate metal layer 90 and the capping layer 55 is formed on the gate oxide layer 75. Then, the contact pad formed of the polysilicon layer 10 is formed just beside the gate stack by interposing the spacer 60. At this time, the gate polysilicon layer 80 fills the recess channel trench 40 to form the recess gate on the whole, and the channel is formed along the outer periphery of the trench 40.

A recess channel array transistor fabricated according to this embodiment may be used as a cell transistor of a memory device such as a DRAM. In this case, the polysilicon layer 10 on the semiconductor substrate 20 acts as a self-aligned contact pad (SAC) in a cell region as well as a raised active in a core region.

Differently from the conventional method of forming the contact pad that is formed after forming a recess channel trench and a gate conductive layer in a semiconductor substrate, a semiconductor substrate is primarily covered with a conductive layer (the polysilicon layer 10 in this embodiment) that becomes a contact pad later according to an embodiment of the present invention as described above. Thereafter, the conductive layer is patterned to form a contact pad and a spacer, and a recess channel trench and a gate conductive layer are formed in the semiconductor substrate. Accordingly, the gate conductive layer is formed by a kind of damascene process in the present invention.

Furthermore, in order to fabricate the recess channel array transistor, an active region, a recess channel trench, a gate and a contact pad can be formed by two times of photolithography that is performed to form an active region pattern and a contact pad pattern over the conventional method that requires four times of photolithography that forms an active region pattern, a recess channel trench pattern, a gate pattern and a contact pattern. In other words, the present invention requires no photolithography that forms the recess channel trench pattern and the gate pattern.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, as shown in FIGS. 4 through 13, the active region of this embodiment has a straight active structure, but a diagonally shaped diagonal active structure may be employed.

According to the present invention as described above, the active region, the recess channel trench, the gate, and the contact pad can be formed by two times of photolithography that forms the active region pattern and the contact pad pattern, thereby securing a sufficient misalignment margin. Thus, inferior devices and decrease of yield caused by the misalignment during the fabricating process can be lowered. Particularly, a difficulty in securing the misalignment induced due to the decreased design rule is solved to simplify the process of fabricating the recess channel array transistor.

Moreover, the greatly decreased times of the photolithography decreases the number of processing, which in turn reduces manufacturing cost. Additionally, the active region pattern, the recess channel trench pattern, the gate pattern, and the contact pattern are more precisely arranged to enhance average device characteristics of products.

What is claimed is:

1. A method of fabricating a recess channel trench comprising:
   ion-implanting a semiconductor substrate to form an impurity region;
   forming a polysilicon layer on the semiconductor substrate;
   selectively etching the polysilicon layer and the semiconductor substrate to form a trench that defines an active region;

filling the trench with an insulating material, and planarizing the resultant structure to form a shallow trench isolation (STI) structure and an interlayer insulating layer;

forming a mask layer on the polysilicon layer and the interlayer insulating layer, and selectively etching the mask layer, the polysilicon layer and the interlayer insulating layer, thereby forming an opening to define a contact pad;

forming a spacer along a sidewall of the opening, and anisotropically etching the semiconductor substrate to form a recess channel trench, using the spacer and the mask layer as an etch mask;

forming a gate insulating layer along an inner wall of the recess channel trench;

forming a gate conductive layer on the gate insulating layer to fill the recess channel trench; and removing the selectively-etched mask layer to expose the polysilicon layer, and forming a capping layer on the gate conductive layer.

2. The method of fabricating the recess channel array transistor of claim 1, wherein the ion-implanting comprises forming source/drain regions in the semiconductor substrate.

3. The method of fabricating the recess channel array transistor of claim 1, wherein the ion-implanting comprises forming an n-type well region that forms a p-channel MOS transistor when the semiconductor substrate is a p-type substrate.

4. The method of fabricating the recess channel array transistor of claim 1, wherein the ion-implanting comprises forming a p-type well region that forms an n-channel MOS transistor when the semiconductor substrate is an n-type substrate.

5. The method of fabricating the recess channel array transistor of claim 1, wherein, while forming the polysilicon layer, a portion of the polysilicon layer in contact with the impurity region of the semiconductor substrate is formed to have a conductivity type identical to that of the impurity region.

6. The method of fabricating the recess channel array transistor of claim 1, wherein the active region defined by the trench has a straight active structure.

7. The method of fabricating the recess channel array transistor of claim 1, wherein the active region defined by the trench has a diagonal active structure.

8. The method of fabricating the recess channel array transistor of claim 1, wherein the STI and the interlayer insulating layer are integrally formed of the same insulating material to include no interface between the STI and the interlayer insulating layer.

9. The method of fabricating the recess channel array transistor of claim 1, wherein the insulating material that fills the trench is selected from the group consisting of an USG layer, a HDP oxide layer, a TEOS layer formed using PECVD, an oxide layer formed using PECVD, and combinations thereof.

10. The method of fabricating the recess channel array transistor of claim 1, wherein the mask layer formed on the polysilicon layer and the interlayer insulating layer is a nitride layer.

11. The method of fabricating the recess channel array transistor of claim 1, wherein selectively etching the mask layer, the polysilicon layer and the interlayer insulating layer to form the opening comprises:

forming a pattern of the mask layer that defines a contact pad pattern by photolithography; and selectively and anisotropically etching the polysilicon layer and the interlayer insulating layer, using the pattern of the mask layer as an etch mask.

12. The method of fabricating the recess channel array transistor of claim 1, wherein forming the spacer along the sidewall of the opening comprises:

depositing an insulating layer for the spacer on the resultant structure that includes the opening; and anisotropically etching the insulating layer to form the spacer.

13. The method of fabricating the recess channel array transistor of claim 1, wherein forming the gate conductive layer comprises:

depositing a polysilicon layer that fills the recess channel trench on the gate insulating layer, and etching-back the polysilicon layer to form a gate polysilicon layer; and forming a metal layer on the gate polysilicon layer, and etching-back the metal layer to form a gate metal layer.

14. The method of fabricating the recess channel array transistor of claim 13, wherein the gate metal layer is formed of W or $WSi_x$.

15. The method of fabricating the recess channel array transistor of claim 1, wherein forming the capping layer comprises:

forming a nitride layer for the capping layer on the remaining mask layer and the gate conductive layer.

16. The method of fabricating the recess channel array transistor of claim 1, wherein the recess channel array transistor fabricated by the fabricating method is used as a cell transistor of a semiconductor memory device.

17. The method of fabricating the recess channel array transistor of claim 16, wherein the polysilicon layer formed on the semiconductor substrate acts as a self-aligned contact pad in a cell region and acts as a raised active region in a core region.

18. The method of fabricating the recess channel array transistor of claim 1, wherein the contact pad contacts the semiconductor substrate.

19. A method of fabricating a recess channel array transistor comprising:

ion-implanting a semiconductor substrate to form an impurity region, and forming a polysilicon layer on the semiconductor substrate;

selectively etching the polysilicon layer and the semiconductor substrate by photolithography to form a trench that defines an active region;

filling the trench with an insulating material and planarizing the resultant structure to integrally form a STI and an interlayer insulating layer on the trench;

forming a nitride layer for a mask on the resultant structure that includes the polysilicon layer and the interlayer insulating layer;

patterning the nitride layer for the mask, the polysilicon layer and the interlayer insulating layer by photolithography to form an opening defining a contact pad;

forming a spacer along sidewalls of the patterned nitride layer, the polysilicon layer, and the interlayer insulating layer;

etching the semiconductor substrate to form a recess channel trench using the patterned mask layer and the spacer as etch masks;

forming a gate oxide layer along an inner wall of the recess channel trench;

forming a conductive polysilicon layer that fills the recess channel trench, and performing etch-back to form a gate polysilicon layer;

forming a metal layer on the gate polysilicon layer, and performing etch-back to form a gate metal layer;

forming a nitride layer for a capping layer on the resultant structure including the mask layer and the gate metal layer; and chemical mechanical polishing the nitride layer to isolate nodes of the contact pad formed of the patterned polysilicon layer.

20. The method of fabricating the recess channel array transistor of claim 19, wherein ion-implanting the semiconductor substrate to form the impurity region comprises forming source/drain regions in the semiconductor substrate.

21. The method of fabricating the recess channel array transistor of claim 19, wherein the polysilicon layer is formed by doping an impurity by an in-situ manner, and being deposited on the semiconductor substrate in a state of doped polysilicon, and a portion of the doped polysilicon layer in contact with the impurity region within the semiconductor substrate has a conductivity type identical to that of the impurity region.

22. The method of fabricating the recess channel array transistor of claim 19, wherein the polysilicon layer is formed by depositing an undoped polysilicon layer and then doping the polysilicon layer by ion implantation to be conductive, and the doped polysilicon layer portion in contact with the impurity region within the semiconductor substrate has a conductivity type identical to that of the impurity region.

23. The method of fabricating the recess channel array transistor of claim 19, wherein the active region defined by the trench has a straight active structure or a diagonal active structure.

24. The method of fabricating the recess channel array transistor of claim 19, wherein the recess channel array transistor is used as a cell transistor of a semiconductor memory device.

25. The method of fabricating the recess channel array transistor of claim 24, wherein the polysilicon layer formed on the semiconductor substrate acts as a self-aligned contact pad in a cell region and acts as a raised active region in a core region.

26. A method of fabricating a recess channel trench comprising:

form an impurity region in a semiconductor substrate;

form a trench that defines an active region in the semiconductor substrate;

filling the trench with an insulating material, and planarizing the resultant structure to form a shallow trench isolation (STI) structure and an interlayer insulating layer;

forming a mask layer on the polysilicon layer and the interlayer insulating layer, and selectively etching the mask layer, the polysilicon layer and the interlayer insulating layer, thereby forming an opening to define a contact pad;

forming a spacer along a sidewall of the opening, anisotropically etching the semiconductor substrate to form a recess channel trench therein, using the spacer and the mask layer as an etch mask;

forming a gate insulating layer along an inner wall of the recess channel trench; and forming a gate conductive layer on the gate insulating layer to fill the recess channel trench.

* * * * *

UNITED STATES PATENT AND TRADEMARK OFFICE
CERTIFICATE OF CORRECTION

PATENT NO. : 7,361,537 B2 Page 1 of 1
APPLICATION NO. : 10/969751
DATED : April 22, 2008
INVENTOR(S) : Je-Min Park It is certified that error appears in the above-identified patent and that said Letters Patent is hereby corrected as shown below:

Column 6, line 32, the word "ease" should read -- case --.

Signed and Sealed this

Second Day of September, 2008

JON W. DUDAS
*Director of the United States Patent and Trademark Office*